(12) United States Patent
Chung

(10) Patent No.: US 10,872,961 B2
(45) Date of Patent: Dec. 22, 2020

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventor: Han-Pin Chung, Kaohsiung County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/102,468

(22) Filed: Aug. 13, 2018

(65) Prior Publication Data

US 2020/0052081 A1 Feb. 13, 2020

(51) Int. Cl.
| | | |
|---|---|---|
| *H01L 29/417* | (2006.01) | |
| *H01L 29/78* | (2006.01) | |
| *H01L 29/66* | (2006.01) | |
| *H01L 29/06* | (2006.01) | |
| *H01L 21/8234* | (2006.01) | |
| *H01L 27/088* | (2006.01) | |

(52) U.S. Cl.
CPC ............ *H01L 29/41791* (2013.01); *H01L 21/823431* (2013.01); *H01L 21/823481* (2013.01); *H01L 27/0886* (2013.01); *H01L 29/0653* (2013.01); *H01L 29/66795* (2013.01); *H01L 29/785* (2013.01)

(58) Field of Classification Search
CPC ..... H01L 21/823431; H01L 21/823821; H01L 21/823481; H01L 21/823878; H01L 27/0886; H01L 27/0924; H01L 29/41791; H01L 29/66795; H01L 29/785; H01L 29/0653; H01L 29/0649
USPC .......................... 257/365, 401, 397; 438/435
See application file for complete search history.

(56) References Cited

U.S. PATENT DOCUMENTS

| | | | | |
|---|---|---|---|---|
| 2016/0254192 A1* | 9/2016 | Sung | ............... | H01L 21/823431 438/435 |
| 2016/0336315 A1* | 11/2016 | You | ................... | H01L 29/42364 |
| 2016/0351565 A1* | 12/2016 | Sung | ................. | H01L 21/76229 |
| 2017/0243790 A1* | 8/2017 | Xie | ................... | H01L 21/31051 |
| 2018/0151565 A1* | 5/2018 | Lee | ................... | H01L 21/02532 |
| 2019/0304841 A1* | 10/2019 | Sung | ............... | H01L 21/823821 |
| 2020/0020782 A1* | 1/2020 | Ching | ................. | H01L 21/3086 |

* cited by examiner

*Primary Examiner* — Mohammed Shamsuzzaman
*Assistant Examiner* — Aaron J Gray
(74) *Attorney, Agent, or Firm* — Maschoff Brennan

(57) ABSTRACT

A method of fabricating a semiconductor device includes forming a plurality of semiconductor fins on a substrate. A liner layer is deposited on the semiconductor fins and on the substrate conformally. The semiconductor fins are patterned to form a plurality of active regions on the substrate after the liner layer is deposited.

20 Claims, 19 Drawing Sheets

SEMICONDUCTOR DEVICE AND MANUFACTURING METHOD THEREOF

BACKGROUND

The semiconductor industry has progressed into nanometer technology process nodes in pursuit of higher device density, higher performance, and lower cost. In the course of integrated circuit (IC) evolution, functional density (i.e., the number of interconnected devices per chip area) has generally increased while geometry size (i.e., the smallest component (or line) that can be created using a fabrication process) has decreased. This scaling down process increases production efficiency and lowers associated costs. Such scaling down has also increased the complexity of processing and manufacturing ICs, and, for these advances to be realized, similar developments in IC manufacturing are desired. For example, novel semiconductor materials, including compound semiconductors, are being investigated to supplement or replace conventional silicon substrates. While these alternative semiconductor materials often possess superior electrical characteristics, just as often they possess their own sets of challenges. Accordingly, this transition to more exacting materials is one of the drivers of new fabrication processes. Therefore, although existing semiconductor fabrication process have been adequate, they have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
FIG. 1A to FIG. 1C are schematic top views of a method for manufacturing a semiconductor device at various stages in accordance with some embodiments of the present disclosure.
Figure 1A:
Figure 1A:
Figure 1A:
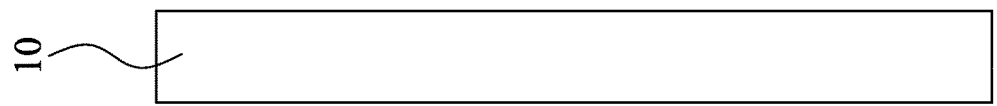

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 1B:
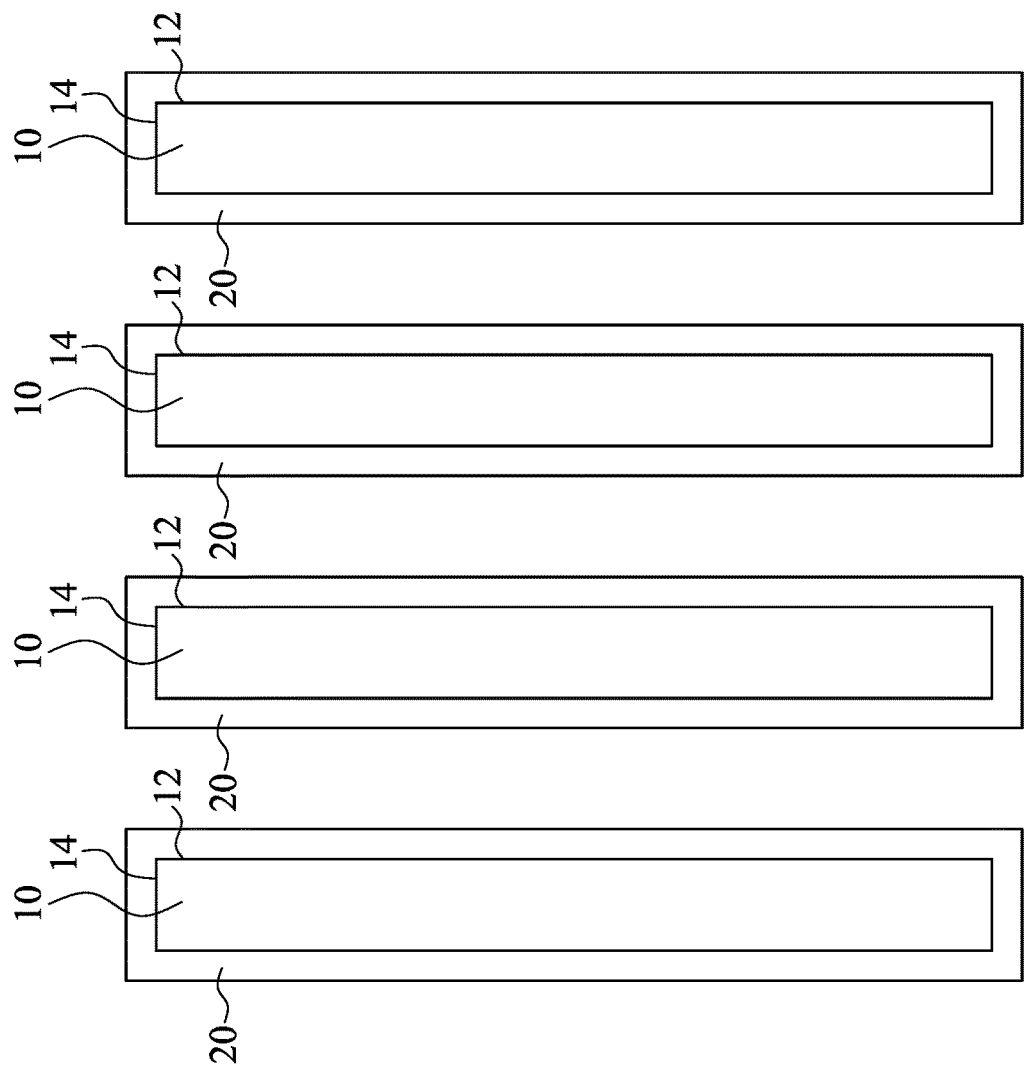
Figure 1C:
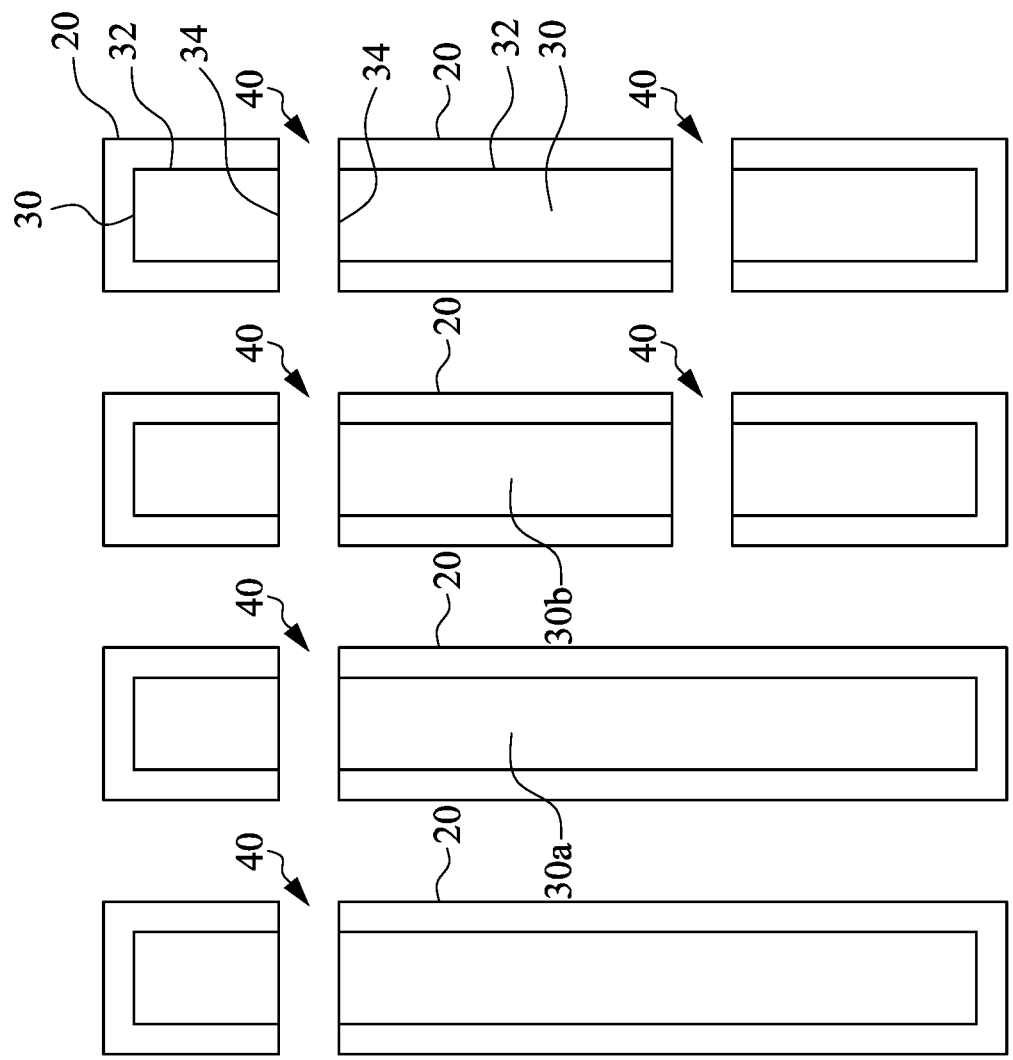

FIG. 1A to FIG. 1C are schematic top views of a method for manufacturing a semiconductor device at various stages in accordance with some embodiments of the present disclosure. The method begins from FIG. 1A, in which a plurality of fins 10 are formed on a substrate. Then, a plurality of liners 20 are formed surrounding the sidewalls of the fins 10, as illustrated in FIG. 1B. The liners 20 can be a single-layer structure or a multi-layer structure that enclose the sidewalls of the fins 10. In some embodiments, the liners 20 at least enclose the main sidewalls 12 (e.g. the sidewalls that parallel to a long axis of the fins 10) and the end sidewalls 14 (e.g. the sidewalls at opposite ends of the fins 10).

After the liners 20 are formed on the sidewalls 12 and 14 of the fins 10, an additional patterning process is performed to cut the fins 10 according to a predetermined layout. As illustrated in FIG. 1C, the fins 10 are cut such that a plurality of active regions 30 are formed, and a plurality of end-to-end trenches 40 are formed between the active regions 30. The liners 20 are remained on the main sidewalls 32 (e.g. the sidewalls that parallel to a long axis of the active regions 30) of the active regions 30, and the end sidewalls 34 (e.g. the sidewalls at opposite ends of the active regions 30) are free from being coverage of the liners 20 because the end-to-end trenches 40 are formed after the liners 20. Therefore, the liners 20 are not present in the end-to-end trenches 40.

In some embodiments, the active regions 30 have more than two dimensions, for example, the active regions 30a have longer lengths, and the active regions 30b have shorter lengths. Also, the ratios of the lengths of the end-to-end trenches 40 to the lengths of the active regions 30 are varied because of the various lengths of the active regions 30. Since the liners 20 are not present in the end-to-end trenches 40 or the end sidewalls 34 of the active regions 30, the effects of the stresses from the liners 20 at the ends of the active regions 30 can be omitted. Thus the end stresses among active regions 30 having different length can be more consistent.

FIGS. 2-5, 6A, 7, 8A, and 9-13 are perspective views of a method for manufacturing a semiconductor device at various stages in accordance with some embodiments of the present disclosure. In some embodiments, the semiconductor device shown in FIGS. 2-5, 6A, 7, 8A, and 9-13 may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 2:
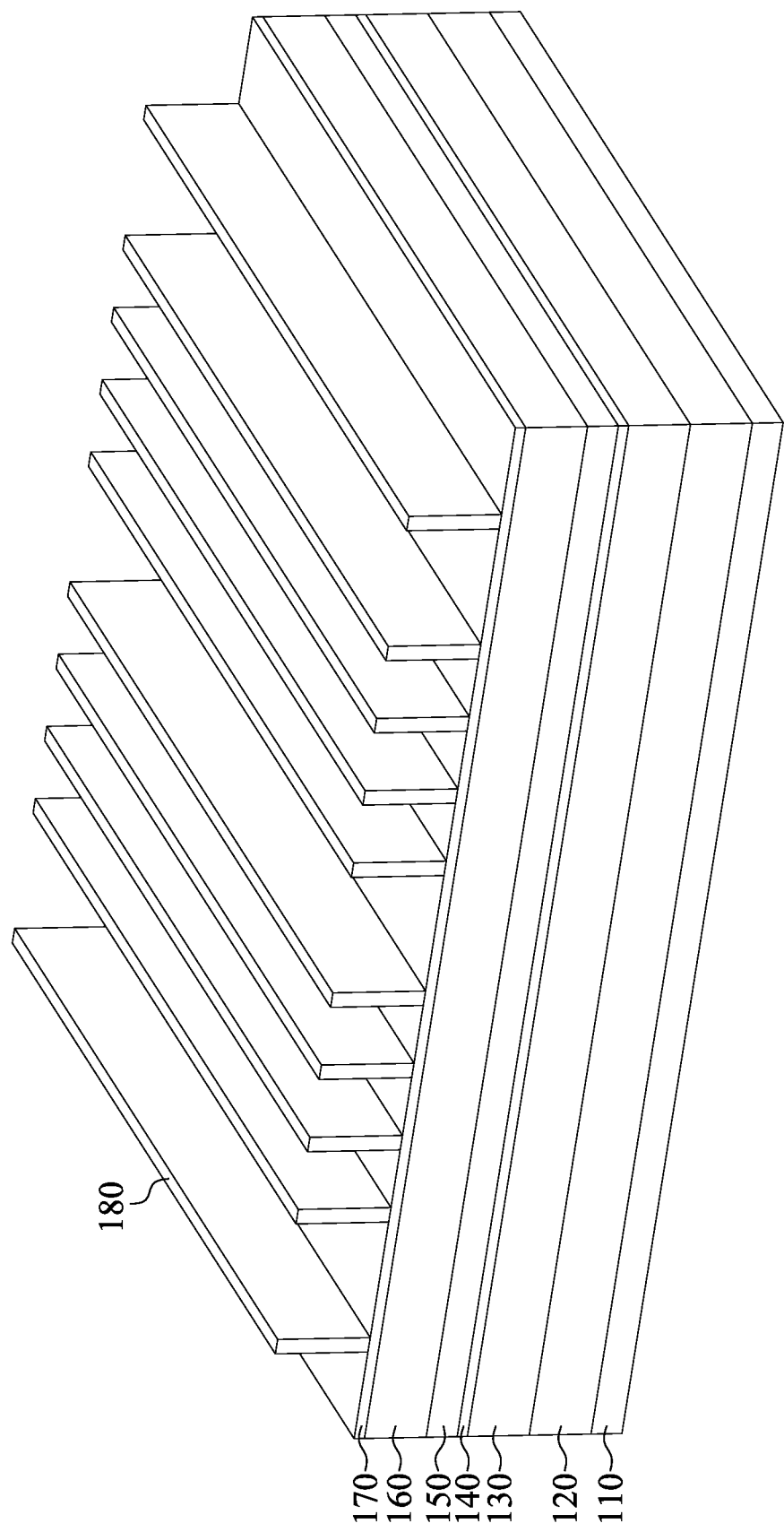
FIGS. 2-5, 6A, 7, 8A, and 9-13 are perspective views of a method for manufacturing a semiconductor device at various stages in accordance with some embodiments of the present disclosure.

Reference is made to FIG. 2. A substrate 110 is provided. In some embodiments, the substrate 110 may include silicon (Si). Alternatively, the substrate 110 may include germanium (Ge), silicon germanium, gallium arsenide (GaAs), or other appropriate semiconductor materials. In some alternative embodiments, the substrate 110 may include an epitaxial layer. Furthermore, the substrate 110 may include a silicon-on-insulator (SOI) structure having a buried dielectric layer therein. The buried dielectric layer may be, for example, a buried oxide (BOX) layer. The SOI structure may be formed by a method referred to as separation by implantation of oxygen (SIMOX) technology, wafer bonding, selective epitaxial growth (SEG), or other appropriate method.

A buffer layer 120 is formed over the substrate 110. The buffer layer 120 and the substrate 110 are made of different materials. In some embodiments, the buffer layer 120 includes an epitaxially grown layer. The epitaxially grown layer may include III-V group compound semiconductor materials, SiGe and/or other suitable materials. In some embodiments, the buffer layer 120 is in contact with the substrate 110. In some embodiments, the thickness of the buffer layer 120 is in a range from about 20 nm to about 60 nm, and if the buffer layer 120 is made of SiGe, the germanium percentage (atomic percentage) of the buffer layer 120 is in a range from about 25 percent to about 60 percent, while higher or lower germanium percentages may be used. With such configuration, the lattice constant of the buffer layer 120 is similar to or substantially the same as the lattice constant of the substrate 110, and thus the defect issue on the top surface of the buffer layer 120, which is caused by lattice relaxation of thicker buffer layer, can be improved. The term "substantially" as used herein may be applied to modify any quantitative representation which could permissibly vary without resulting in a change in the basic function to which it is related.

A channel layer 130 is formed over the buffer layer 120. The channel layer 130 may include an epitaxially grown layer. In some embodiments, the channel layer 130 may be a pure silicon layer that is substantially free from germanium. The channel layer 130 may also be substantially pure silicon layers, for example, with a germanium percentage lower than about 1 percent. In some other embodiments, the material of the channel layer 130 may include SiGe or other suitable materials. As mentioned above, since the defect issue of the buffer layer 120 is improved, the epitaxial quality of the channel layer 130 can be improved as well.

A pad layer 140 and a mask layer 150 are formed over the channel layer 130. The pad layer 140 includes a dielectric material, such as silicon oxide, silicon nitride, silicon oxynitride, or any other suitable dielectric material. The mask layer 150 includes a dielectric material, such as silicon oxide, silicon nitride, silicon oxynitride, or any other suitable dielectric material. In some embodiments, the mask layer 150 is a hard mask layer. In some embodiments, the pad layer 140 is a silicon oxide layer deposited over the channel layer 130, and the mask layer 150 is a silicon nitride layer deposited over the pad layer 140. The pad layer 140 and the mask layer 150 can be formed by thermal oxidation, chemical oxidation, atomic layer deposition (ALD), chemical vapor deposition (CVD), or any other appropriate method. In some embodiments, the thickness of the pad layer 140 may be in a range from about 10 nm to about 80 nm, and the thickness of the mask layer 150 may be in a range from about 20 nm to about 200 nm.

A transfer layer 160 is formed over the mask layer 150. In some embodiments, the transfer layer 160 includes a dielectric material, such as silicon oxide, silicon nitride, silicon oxynitride, or any other suitable dielectric material. The transfer layer 160 is used to transfer the pattern of first mask patterns 180 (formed over the transfer layer 160) to the mask layer 150 in the following process.

An etch stop layer 170 is formed over the transfer layer 160. The etch stop layer 170 may be a masking material such as silicon oxynitride, although other suitable materials, such as silicon oxide or silicon nitride, may alternatively be utilized, and may be formed by a process such as atomic layer deposition (ALD). However, any other suitable processes and thicknesses may alternatively be utilized.

A plurality of first mask patterns 180 are formed over the etch stop layer 170. In some embodiments, the first mask patterns 180 may be formed of SiN, AlO, AlON, TaN, TiN, TiO, or SiO, although other materials such as nitrides, oxides, oxynitrides, carbides, borides, combinations thereof, or the like, could alternatively be used. In some embodiments, a patterned layer (not shown) can be formed over the etch stop layer 170, and a blanketing mask layer (not shown) is conformally formed over the patterned layer. The blanketing mask layer is then etched to remove portions of the blanketing mask layer from the topmost surface of the patterned layer and the top surface of the etch stop layer 170. Portions of the blanketing mask layer remaining on the sidewalls of the patterned layer forms the first mask patterns 180. The patterned layer is then removed. The blanketing mask layer may be formed using, for example, low pressure CVD (LPCVD), PVD, ALD, the like, or the combination thereof. The first mask patterns 180 are patterned according to the layout design of semiconductor fins. For example, the first mask patterns 180 are patterned as elongated strips. The first mask patterns 180 are extended along a direction and have a long axis.

Figure 3:
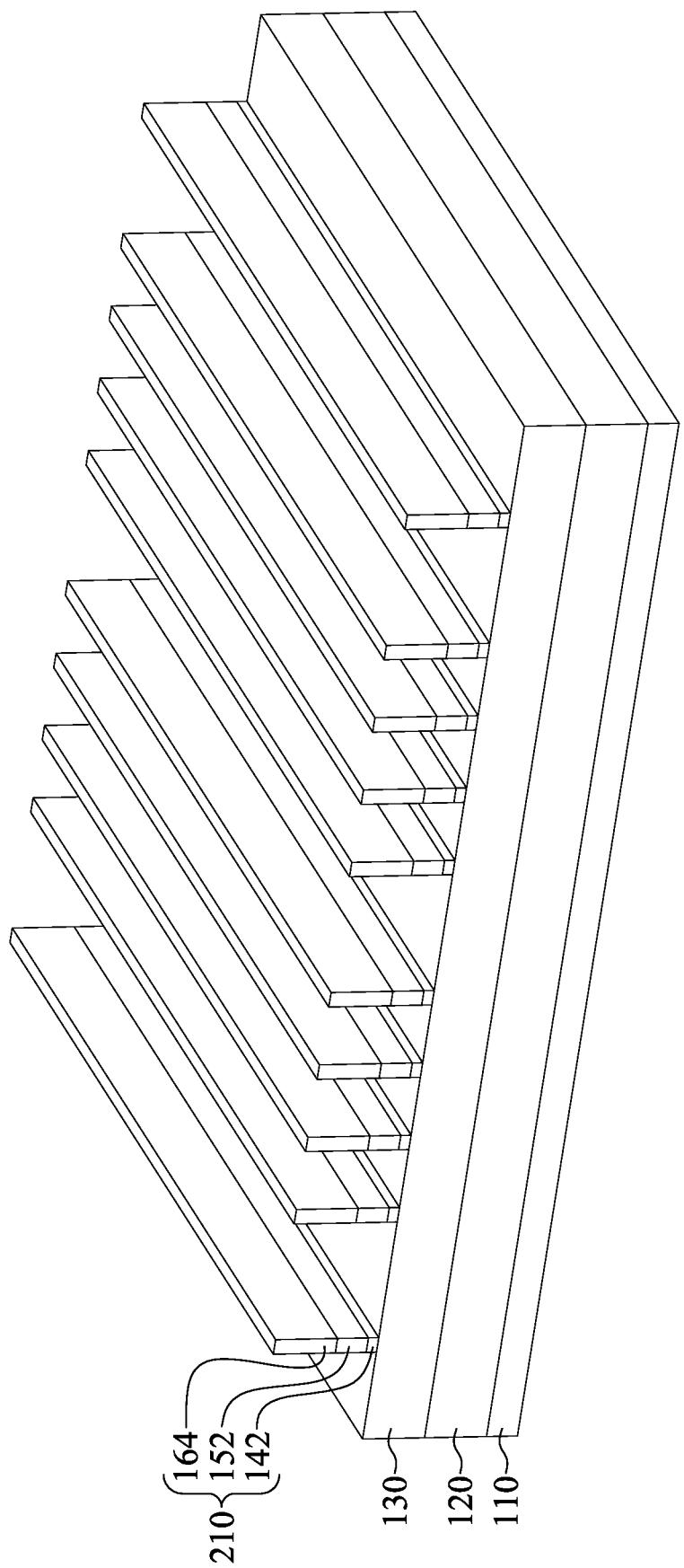

Reference is made to FIG. 3. The transfer layer 160, the mask layer 150, and the pad layer 140 (see FIG. 2) are patterned using the first mask patterns 180 as masks. The remaining portions of the transfer layer 162, the mask layer 152, and the pad layer 142 are referred to as second mask patterns 210. The transfer layer 160, the mask layer 150, and the pad layer 140 can be partially removed by performing multiple etching processes. After forming the second mask patterns 210, the first mask patterns 180 and the patterned etch stop layer 170 (see FIG. 2) are removed.

Figure 4:
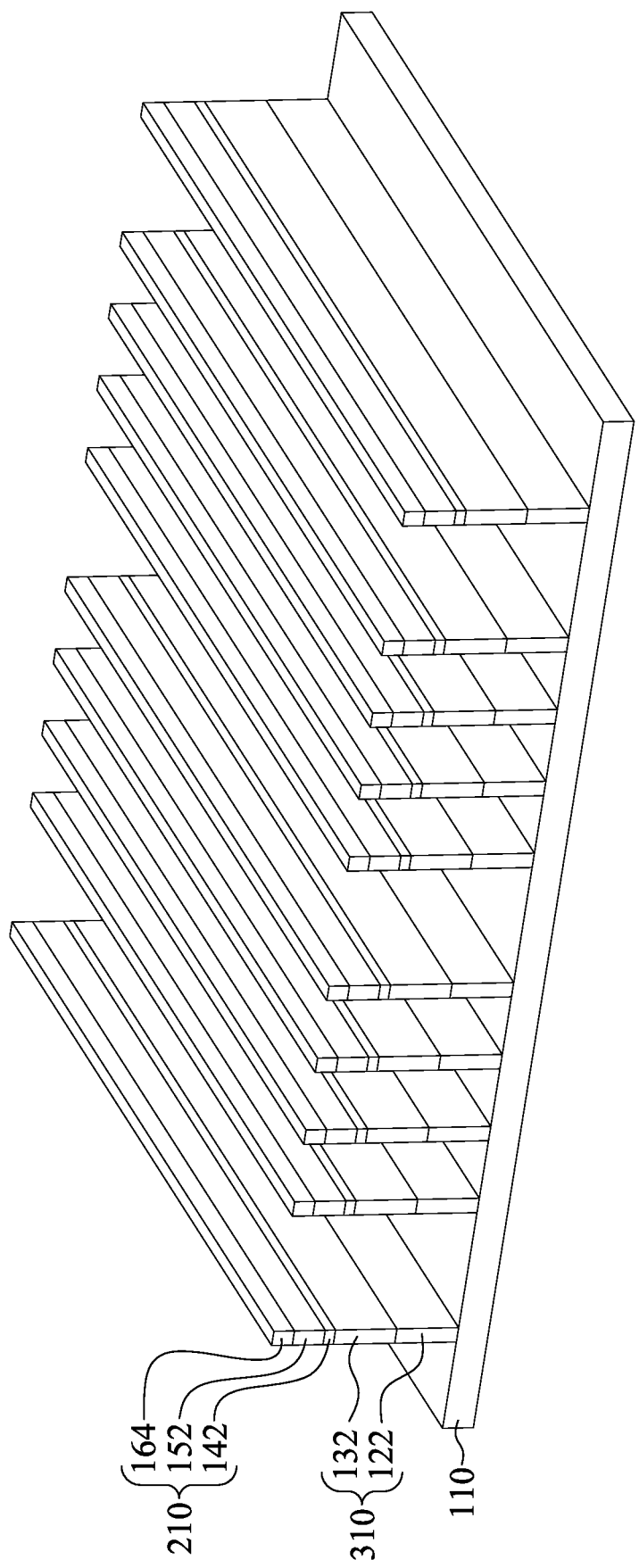

Reference is made to FIG. 4. The buffer layer 120 and the channel layer 130 (see FIG. 3) are patterned using the second mask patterns 210 as masks. Accordingly, a plurality of semiconductor fins 310 are formed respectively under the second mask patterns 210. The remaining portions of the buffer layer 122 and the channel layer 132 are referred to as the semiconductor fins 310. The semiconductor fins 310 are extended along the direction and have a long axis.

The buffer layer 120 and the channel layer 130 can be partially removed by performing single or multiple etching processes. During forming the semiconductor fins 310, upper portions of the transfer layers 162 (see FIG. 3) may be removed to form transfer layers 164.

Figure 5:
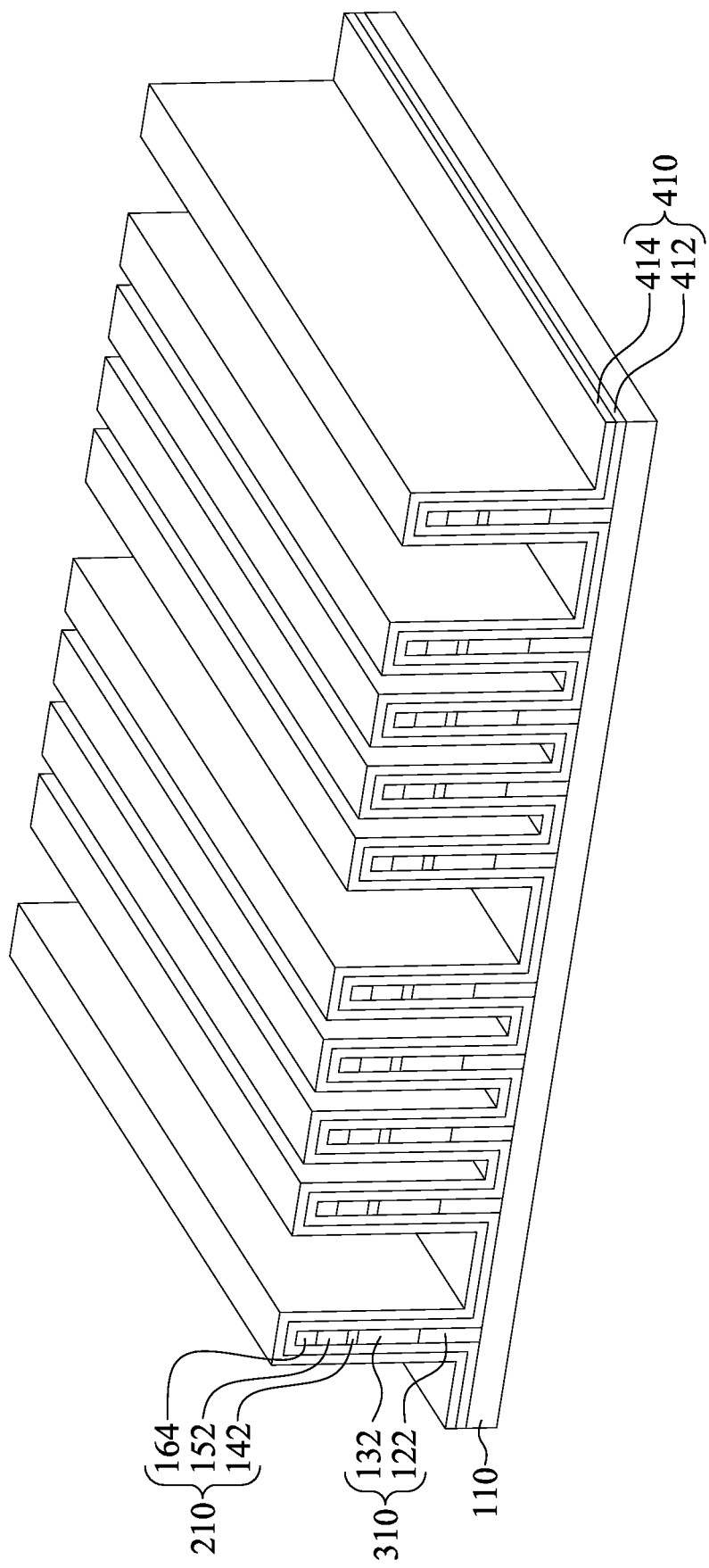

Reference is made to FIG. 5. A liner layer 410 is conformally formed over the semiconductor fins 310 and the second mask patterns 210. In some embodiments, the liner layer 410 may include oxide or nitride, such as SiOCN or SiCN. The liner layer 410 may include a high-κ dielectric material or other suitable material. In some embodiments, the liner layer 410 can be a single-layer structure. In some other embodiments, the liner layer 410 can be a multi-layer structure. For example, the liner layer 410 includes a first dielectric layer 412 and a second dielectric layer 414, in which the first dielectric liner 412 is in contact with the semiconductor fins 310 and the second mask patterns 210, and the second dielectric liner 414 is deposited on the first dielectric liner 412. In some embodiments, the first dielectric liner 412 is an oxide film, and the second dielectric liner 414 is a nitride film such as a SiN film. In various examples, the liner layer 410 may be deposited by an ALD process, a CVD process, a subatmospheric CVD (SACVD) process, a PVD process, or other suitable process.

The liner layer 410 is conformally formed over the semiconductor fins 310 and the second mask patterns 210 and is in contact with the sidewalls of the semiconductor fins 310. In some embodiments, the liner layer 410 can be utilized to repair the defects on the semiconductor fins 310. In some embodiments, the liner layer 410 is a utilized as a blocking layer to protect the semiconductor fins 310. For example, the liner layer 140 can block the semiconductor fins 310 from the moisture and the oxygen in the following process. In some embodiments, the liner layer 410 protects the semiconductor fins 310 during the annealing process or other subsequent formation of the dummy gate structure to prevent unwanted effects or damages to the semiconductor fins 310 by subsequent processing.

Figure 6A:
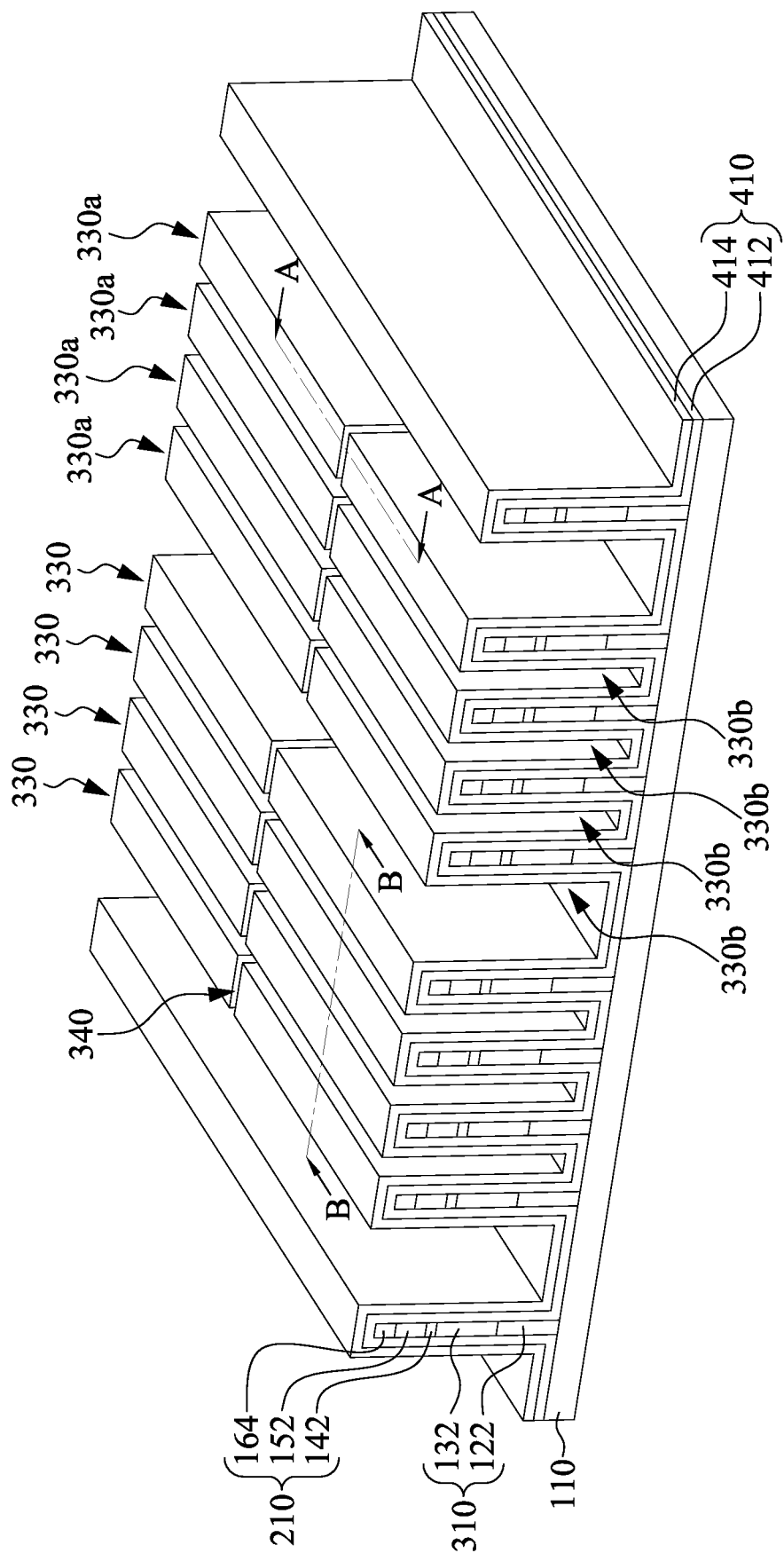

Reference is made to FIG. 6A. A plurality of third mask patterns (not shown) are formed on the semiconductor fins 310. The third mask patterns have a plurality of holes to define a plurality of cut openings 340 in the semiconductor fins 310. In some embodiments, the holes are located right above the semiconductor fins 310 to expose portions of liner layer 410. The semiconductor fins 310 and the liner layer 410 thereon are patterned using the third mask patterns as a mask. The semiconductor fins 310 and the liner layer 410 can be partially removed by performing multiple etching processes. After the semiconductor fins 310 are cut, the third mask patterns are removed.

As a result, a plurality of fin structures 330 (including the semiconductor fins 310 and the second mask layer 210) are disposed on the substrate 110. A plurality of cut openings 340 are disposed between the fin structures 330. The cut openings 340 are formed to cut the semiconductor fins 310 and to separate the fin structures 330. Each of the fin structures 330 has a long axis and two opposite ends along the long axis. Each of the cut openings 340 is located between ends of the adjacent fin structures 330, and thus the cut openings 340 are also regard as end-to-end cut openings.

In some embodiments, after the cut openings 340 are formed between the fin structures 330, the fin structures 330 may include more than two dimensions. That is, the lengths of the fin structures 330 may not be uniformed in the layout. For example, the fin structures 330a have longer length than the fin structures 330b. Also, the length of the cut openings 340 can be the same or different.

Figure 6B:
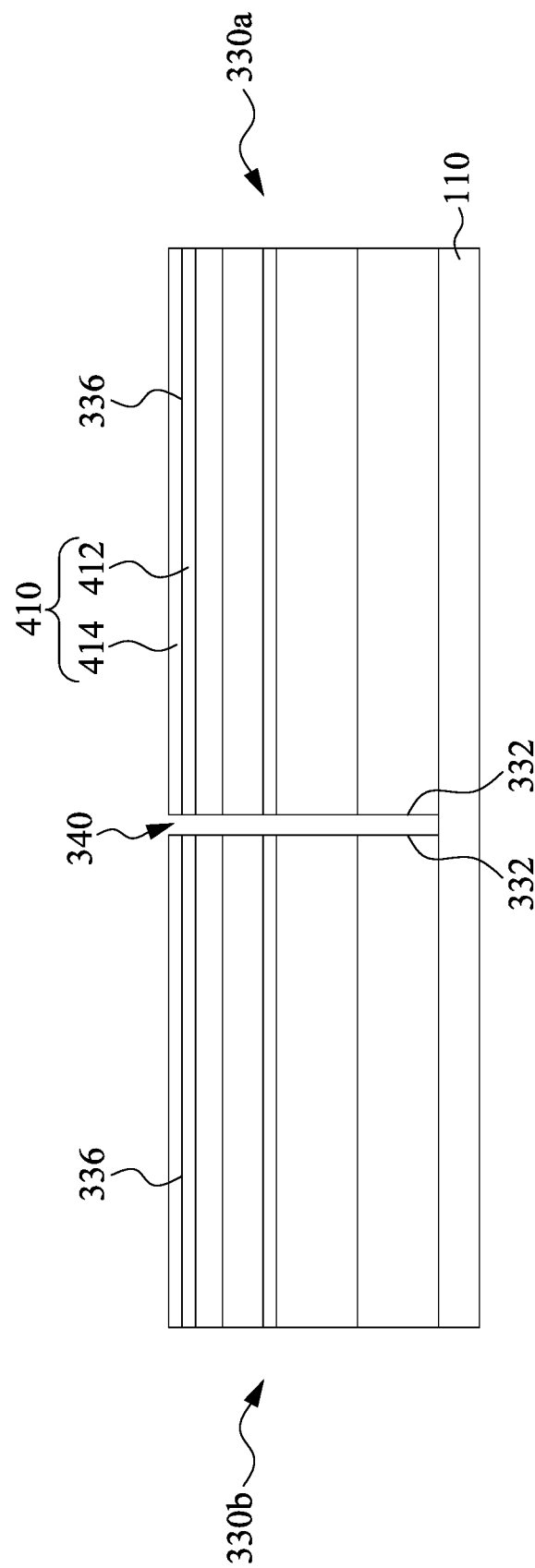
FIG. 6B is a cross-sectional view taken along line A-A of FIG. 6A.
Figure 6C:
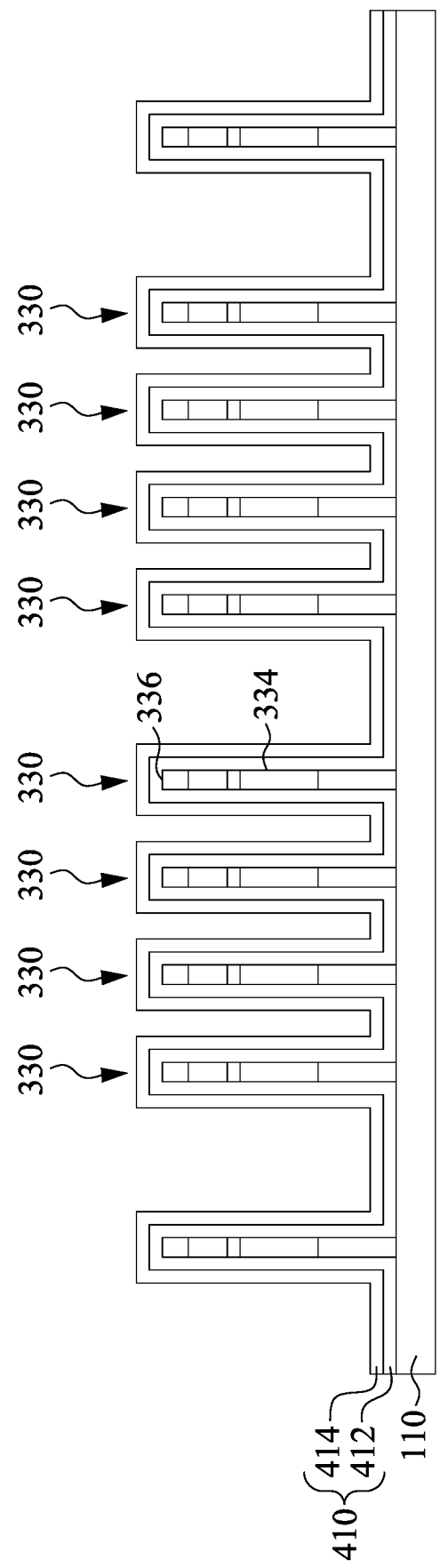
FIG. 6C is a cross-sectional view taken along line B-B of FIG. 6A.

Reference is made to FIG. 6A, FIG. 6B and FIG. 6C, in which FIG. 6B is a cross-sectional view taken along line A-A of FIG. 6A, and FIG. 6C is a cross-sectional view taken along line B-B of FIG. 6A. Referring to FIG. 6A and FIG. 6B, the liner layer 410 is broken at the cut opening 340. The adjacent fin structure 330a and fin structure 330b are disposed end-to-end. That is, the end of the fin structure 330a faces the end of the fin structure 330b, and the cut opening 340 is disposed between the fin structure 330a and the fin structure 330b. The liner layer 410 is disposed on the top surfaces 336 and the main sidewalls of the fin structures 330. The liner layer 410 is not disposed on the end sidewalls 332 of the fin structures 330 and is not disposed on the portion of the substrate 110 which is exposed by the cut opening 340. In other word, the liner layer 410 is formed prior to forming the cut opening 420 to separate the fin structures 330. Therefore the liner layer 410 would not be formed at the end sidewalls 332 of the fin structures 330.

Referring to FIG. 6A and FIG. 6C, the liner layer 410 is continuously extended across the fin structures 330 that are parallel arranged. The liner layer 410 is conformally formed on main sidewalls 334 (e.g. the sidewalls that parallel to the long axis of the fin structures 330) and the top surface of the fin structures 330. The spaces of the substrate 110 between the parallel fin structures 330 are deposited with liner layer 410.

Figure 7:
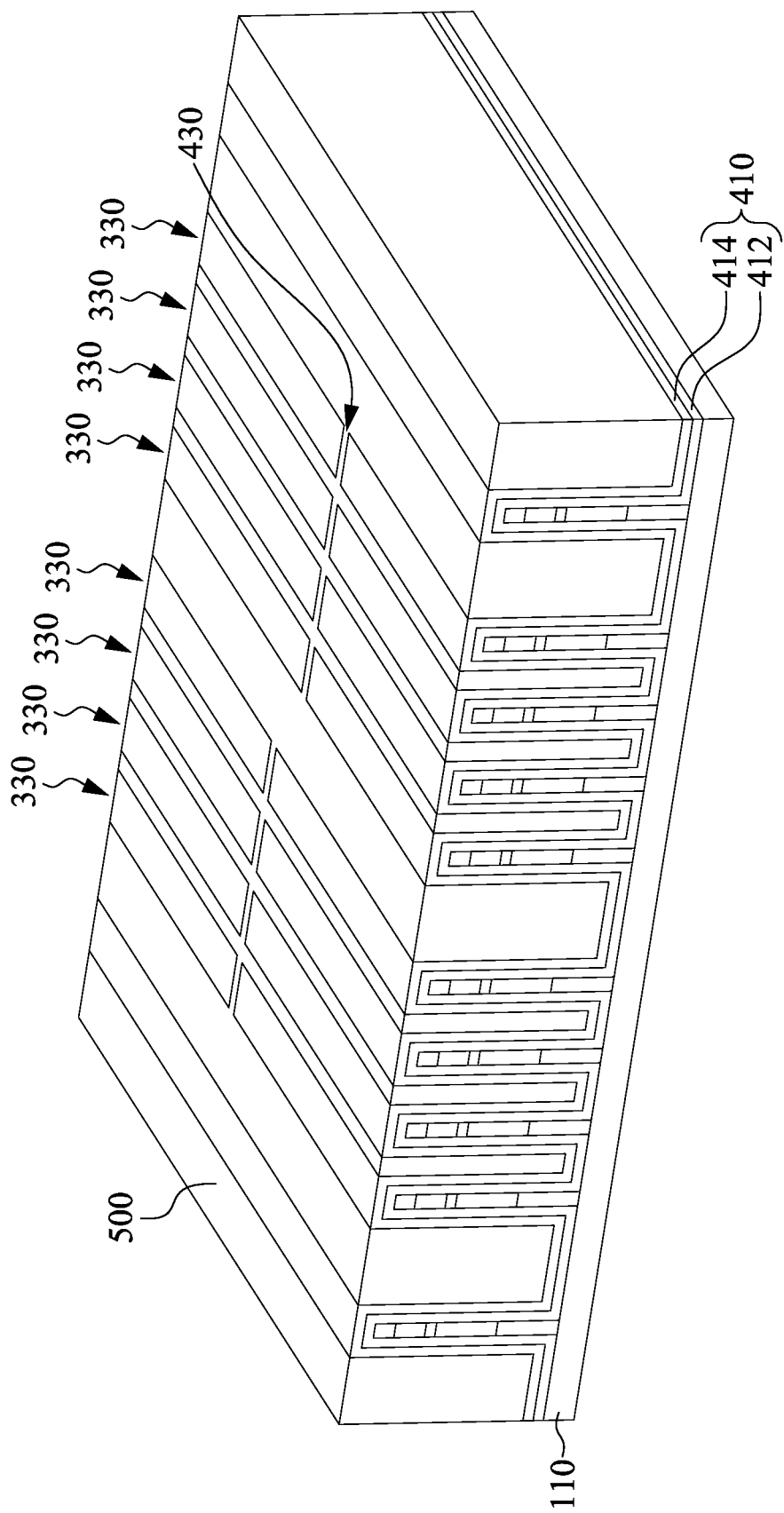

Reference is made to FIG. 7. Isolation material 500 is formed to surround the fin structures 330. The formation of the isolation material 500 may include filling the space around the fin structures 330 with a dielectric material. The isolation material 500 can be formed using, for example, flowable chemical vapor deposition (FCVD), and performing a chemical mechanical polish (CMP) to level the top surface of the dielectric material with the top surface of the fin structures 330 or level with the top surface of the liner layer 410. In some embodiments, the cut openings 430 between the fin structures 330 are also filled with the isolation material.

Figure 8A:
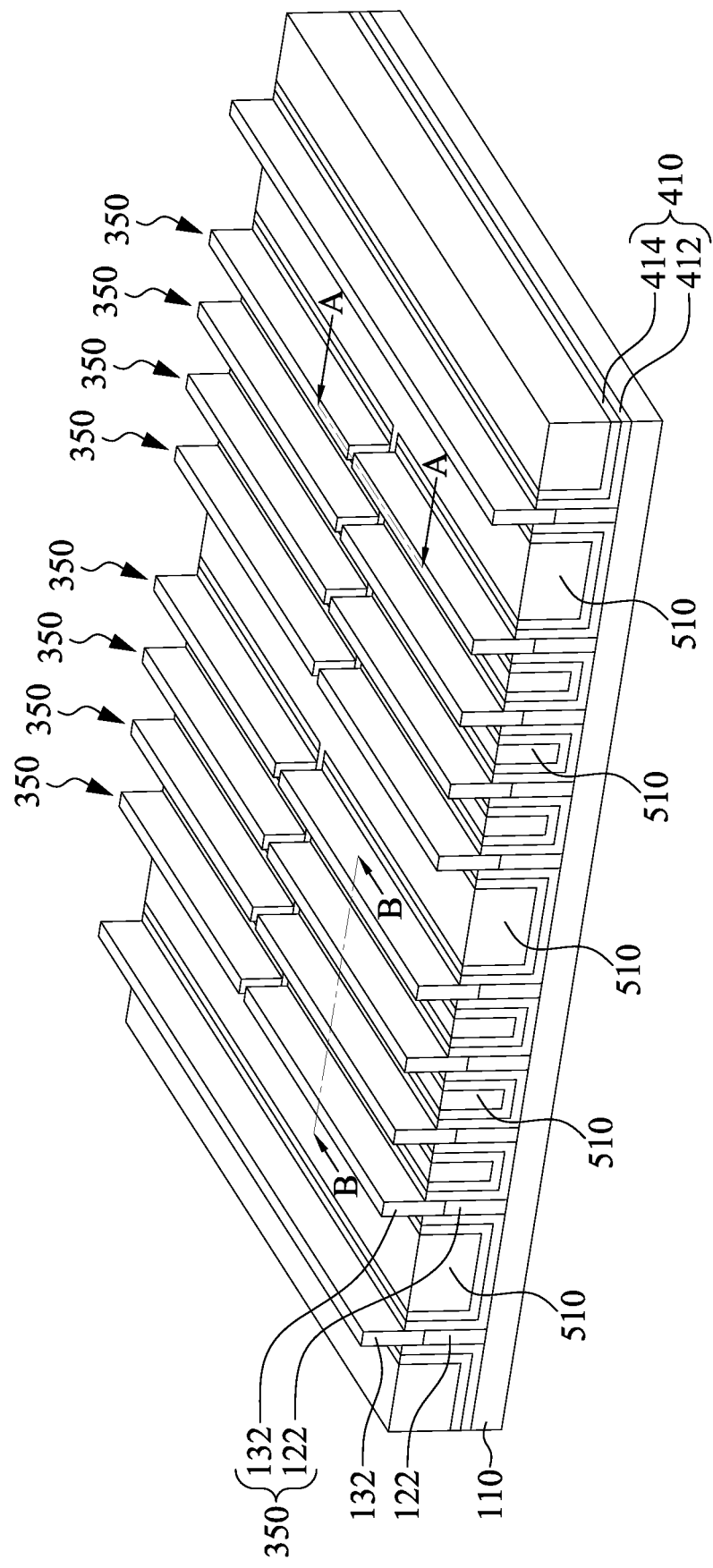

Reference is made to FIG. 8A. The isolation material 500 of FIG. 7 is recessed to form isolation structures 510 adjacent to and in contact with the bottom portions of the fin structures 330 of FIG. 7. The portions of the liner layer 410 above the isolation structures 510 are removed. Also, the second mask patterns 210 of FIG. 7 are removed as well. The buffer layers 122 and the channel layers 132 are remained on the substrate 110 and are protruded from the isolation structures 510. That is, the top surfaces of the resulting isolation structures 510 are lower than the top surfaces of the channel layer 132. In some embodiments, the top surfaces of the resulting isolation structures 510 are higher than the interfaces of the buffer layers 122 and the channel layers 132. In some other embodiments, the top surfaces of the resulting isolation structures 510 are lower, or level with the interfaces of the buffer layers 122 and the channel layers 132.

The remaining buffer layers 122 and the channel layers 132 can serve as active regions 350. The active regions 350 are disposed on the substrate 110 and are protruded from the isolation structures 510. In some embodiments, the active regions 350 are in a parallel arrangement and have various lengths.

Figure 8B:
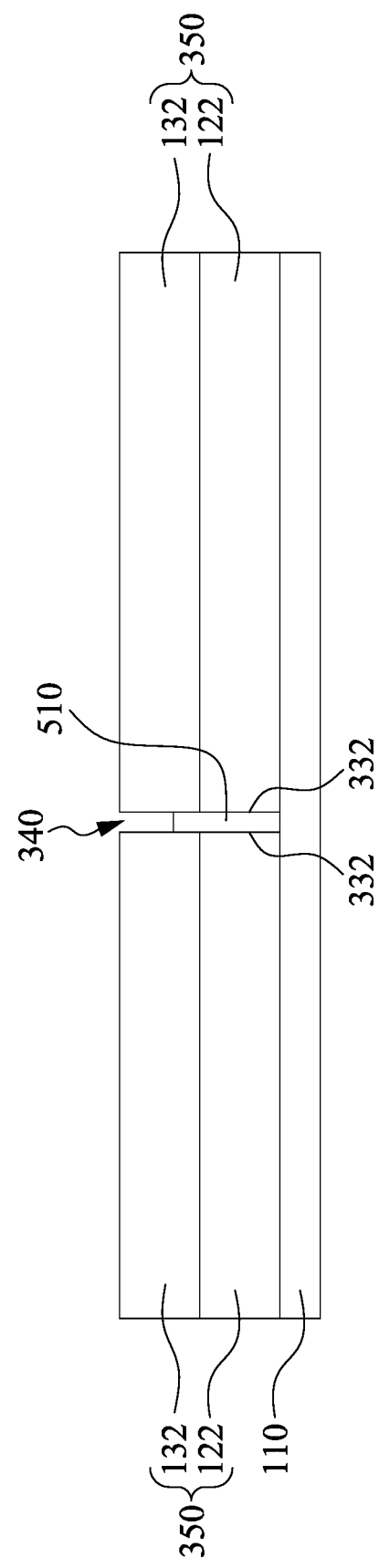
FIG. 8B is a cross-sectional view taken along line A-A of FIG. 8A.
Figure 8C:
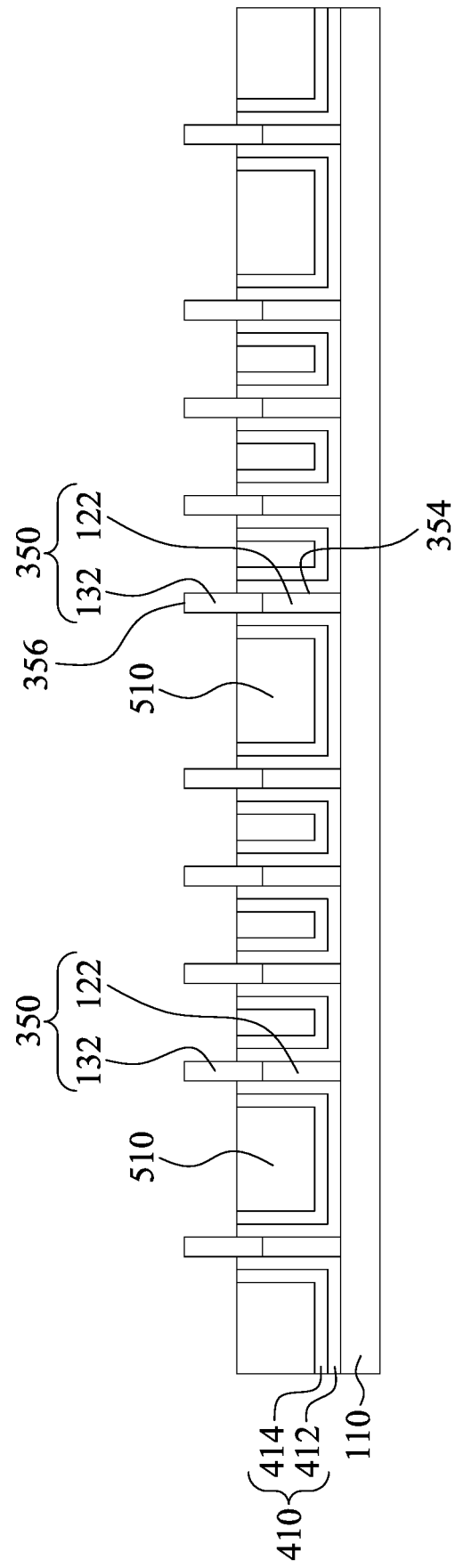
FIG. 8C is a cross-sectional view taken along line B-B of FIG. 8A.

Reference is made to FIG. 8A, FIG. 8B and FIG. 8C, in which FIG. 8B is a cross-sectional view taken along line A-A of FIG. 8A, and FIG. 8C is a cross-sectional view taken along line B-B of FIG. 8A. Referring to FIG. 8A and FIG. 8B, the end-to-end cut opening 342 is once again revealed between the adjacent active regions 350 after recessing the isolation material. The end-to-end cut opening 342 is partially filled with the isolation material. For example, the isolation structure 510 is disposed between the ends of the active regions 350. The isolation structure 510 connects the bottom portion of the active regions 350, at the short ends (e.g. the ends that adjacent the end-to-end cut opening 342). In other word, the isolation structure 510 in the end-to-end cut opening 342 is directly in contact with the bottom portions of the active regions 350, at the short ends.

Referring to FIG. 8A and FIG. 8C, the liner layer 410 is disposed between the isolation structures 510 and the active regions 350 at positions other than the end-to-end cut opening 342 (see FIG. 8B). For example, at the positions other than the end-to-end cut opening 342, the liner layer 410 wraps the isolation structures 510 and is disposed between the sidewalls of the isolation structures 510 and the active regions 350 and is between and the bottom surfaces of the isolation structures 510 and the substrate 110.

Referring to FIG. 8B and FIG. 8C, each of the active regions 350 has a pair of end sidewalls 352, a pair of main sidewalls 354, and a top surface 356, in which the main sidewalls 354 are the sidewalls that parallel to a long axis of the active region 350, and the end sidewalls 352 are the sidewalls at opposite ends of the active region 350. The bottom portion of the main sidewalls 354 of the active region 350 are still covered by the liner layer 410. The end sidewalls 352 and the top surface 356 of the active region 350 are free from being coverage of the liner layer 410. At the end-to-end cut opening 342, the bottom portions of the adjacent active regions 350 are connected by the isolation structure 510 without the liner layer 410. At the positions other than the end-to-end cut opening 342, the bottom portions of the adjacent active regions 350 are connected by both the isolation structure 510 and the liner layer 410.

Figure 9:
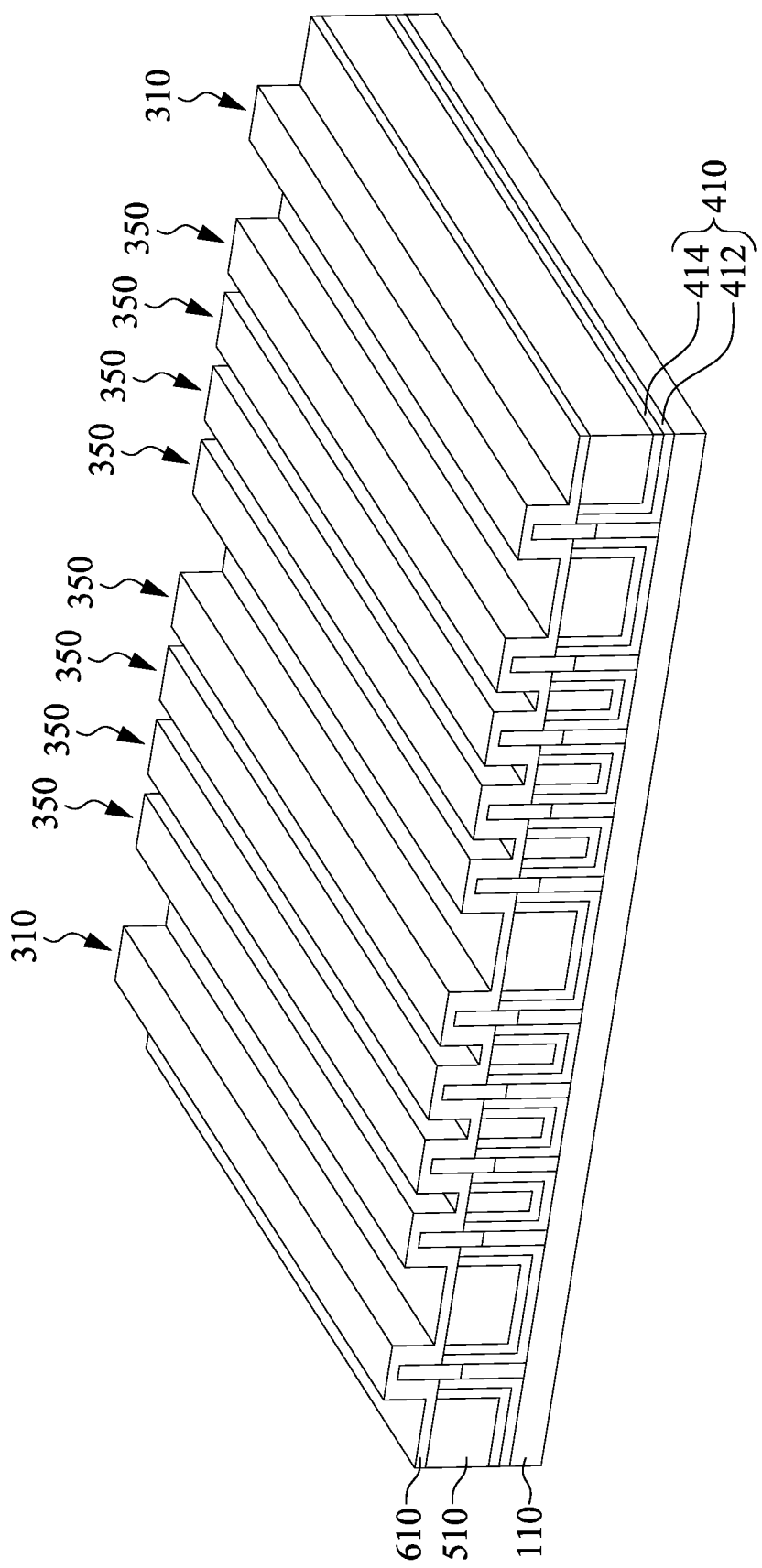

Reference is made to FIG. 9. A dummy dielectric layer 610 is conformally formed to cover the semiconductor fins 310, the active regions 350, and the isolation structures 510. In some embodiments, the dummy dielectric layer 610 may include silicon dioxide, silicon nitride, a high-κ dielectric material or other suitable material. In various examples, the dummy dielectric layer 810 may be deposited by an ALD process, a CVD process, a subatmospheric CVD (SACVD) process, a flowable CVD process, a PVD process, or other suitable process. By way of example, the dummy dielectric layer 610 may be used to prevent damage to the semiconductor fins 310 and the active regions 350 by subsequent processing (e.g., subsequent formation of the dummy gate structure). In some embodiments, the end-to-end cut openings 340' (see FIG. 8B) are filled with the dummy dielectric layer 610.

Figure 10:
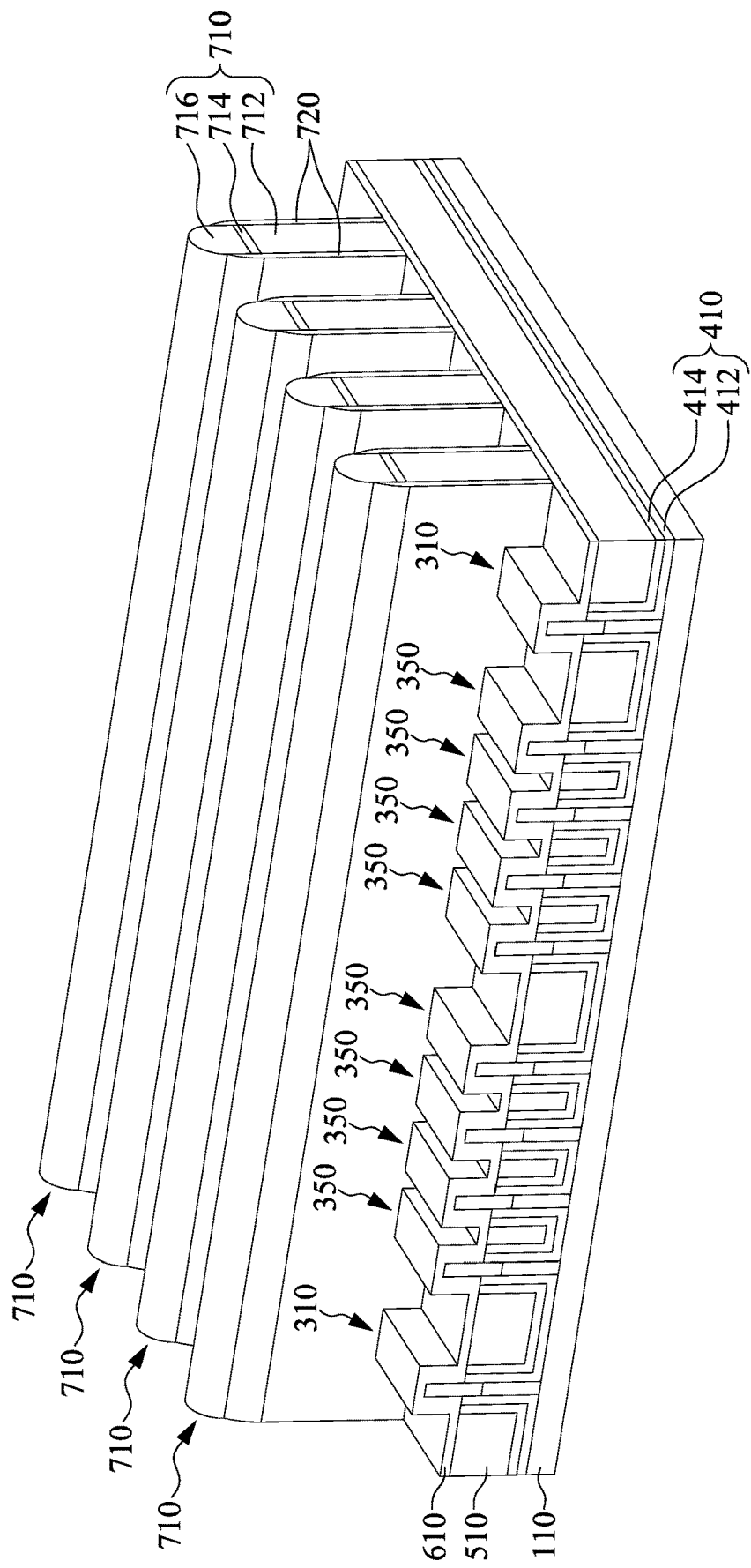

Reference is made to FIG. 10. A plurality of dummy gate stacks 710 are formed over the dummy dielectric layer 610, the semiconductor fins 310, the active regions 350, and the isolation structures 510. The dummy gate stacks 710 are formed across the semiconductor fins 310 and the active regions 350.

The dummy gate stack 710 includes a dummy gate electrode 712, a pad layer 714 formed over the dummy gate electrode 712, and a hard mask layer 716 formed over the pad layer 714. In some embodiments, a dummy gate layer (not shown) may be formed over the dummy dielectric layer 610, the pad layers 714 and the hard mask layers 716 are formed over the dummy gate layer. The dummy gate layer is then patterned using the pad layers 714 and the hard mask layers 716 as masks to form the dummy gate electrode 712. As such, the dummy gate electrode 712, the pad layer 714, and the hard mask layer 716 are referred to as the dummy gate stack 710. In some embodiments, the dummy gate electrode 712 may be made of polycrystalline-silicon (poly-Si), poly-crystalline silicon-germanium (poly-SiGe), or other suitable materials. The pad layer 714 may be made of silicon dioxide or other suitable materials, and the hard mask layer 716 may be made of silicon nitride or other suitable materials.

Spacer structures 720 are at least formed on opposite sides of the dummy gate stacks 710. The spacer structures 720 may include a seal spacer and a main spacer (not shown). The spacer structures 720 include one or more dielectric materials, such as silicon oxide, silicon nitride, silicon oxynitride, SiCN, SiCxOyNz, or combinations thereof. The seal spacers are formed on sidewalls of the dummy gate stacks 710 and the main spacers are formed on the seal spacers. The spacer structures 720 can be formed using a deposition method, such as plasma enhanced chemical vapor deposition (PECVD), low-pressure chemical vapor deposition (LPCVD), sub-atmospheric chemical vapor deposition (SACVD), or the like. The formation of the spacer structures 720 may include blanket forming spacer layers and then performing etching operations to remove the horizontal portions of the spacer layers. The remaining vertical portions of the spacer layers form the spacer structures 720.

Figure 11:
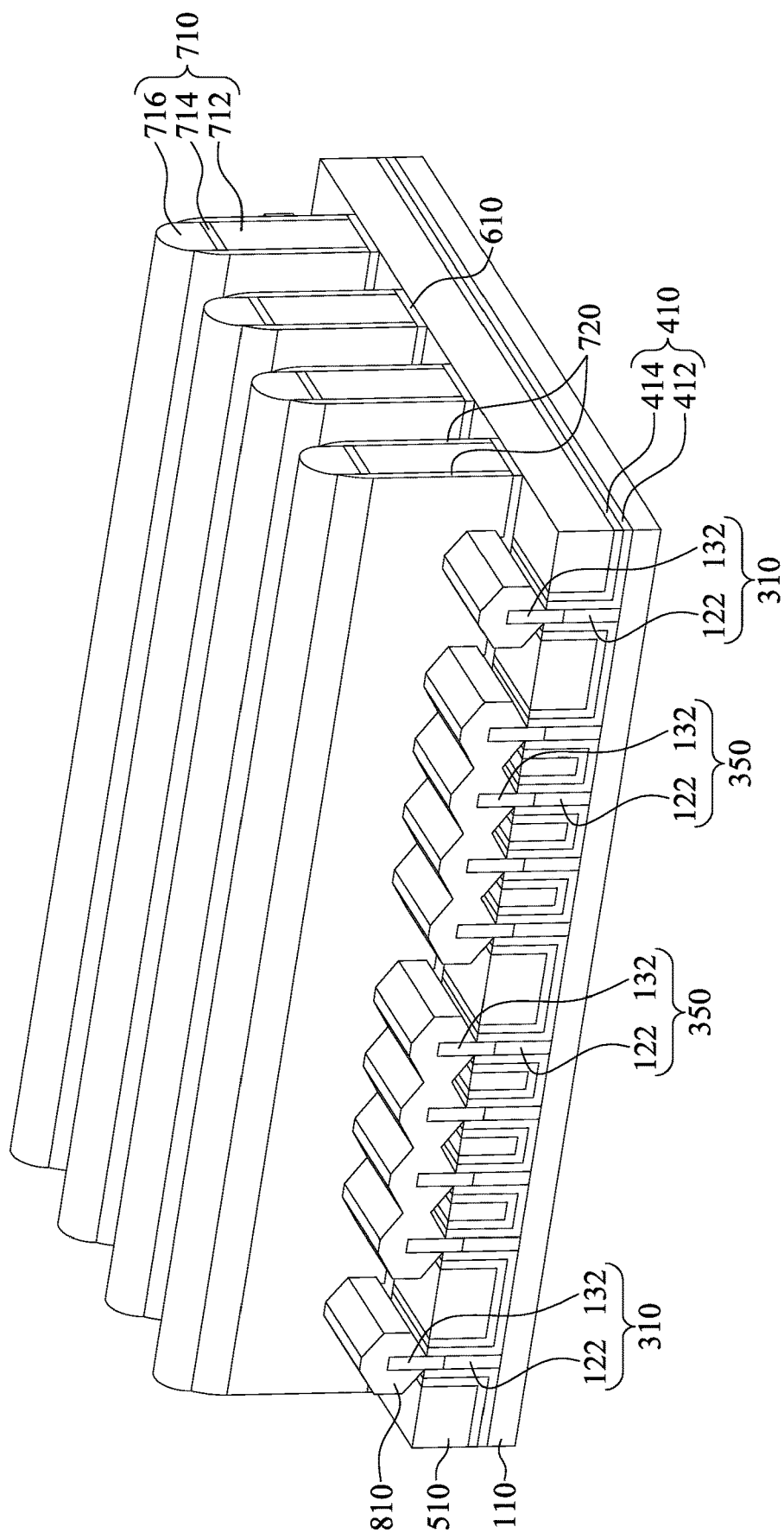

Reference is made to FIG. 11. Portions of the dummy dielectric layer 610 uncovered by the dummy gate stacks 710 and the spacer structures 720 are removed to expose the semiconductor fins 310, the active regions 350, and the isolation structures 510. Epitaxy structures 810 are then formed on portions of the semiconductor fins 310 and the active regions 350 uncovered by the dummy gate stacks 710 and the spacer structures 720 by performing, for example, a selectively growing process. The epitaxy structures 810 are formed by epitaxially growing a semiconductor material. The semiconductor material includes single element semiconductor material, such as germanium (Ge) or silicon (Si), compound semiconductor materials, such as gallium arsenide (GaAs) or aluminum gallium arsenide (AlGaAs), or semiconductor alloy, such as silicon germanium (SiGe) or gallium arsenide phosphide (GaAsP). The epitaxy structures 810 have suitable crystallographic orientations (e.g., a (100), (110), or (111) crystallographic orientation). In some embodiments, the epitaxy structures 810 include source/drain epitaxial structures. In some embodiments, where an N-type device is desired, the epitaxy structures 810 may include an epitaxially growing silicon phosphorus (SiP) or silicon carbon (SiC). In some embodiments, where a P-type device is desired, the epitaxy structures 810 may include an epitaxially growing silicon germanium (SiGe). The epitaxial processes include CVD deposition techniques (e.g., vapor-phase epitaxy (VPE) and/or ultra-high vacuum CVD (UHV-CVD)), molecular beam epitaxy, and/or other suitable processes.

Figure 12:
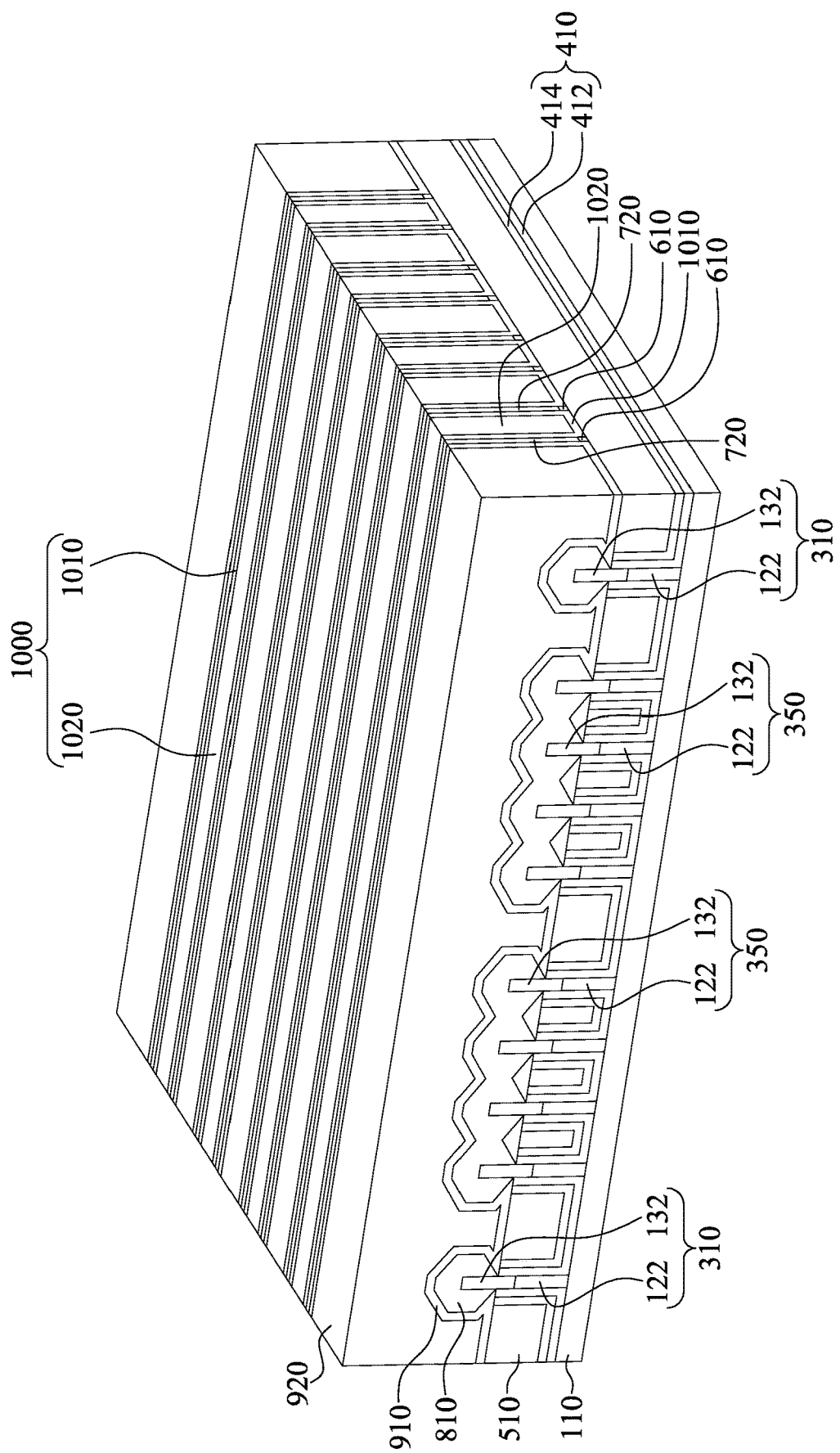

Reference is made to FIG. 12. A contact etch stop layer (CESL) 910 is conformally formed over the structure of FIG. 11. In some embodiments, the CESL 910 can be a stressed layer or layers. In some embodiments, the CESL 910 has a tensile stress and is formed of $Si_3N_4$. In some other embodiments, the CESL 910 includes materials such as oxynitrides. In yet some other embodiments, the CESL 910 may have a composite structure including a plurality of layers, such as a silicon nitride layer overlying a silicon oxide layer. The CESL 910 can be formed using plasma enhanced CVD (PECVD), however, other suitable methods, such as low pressure CVD (LPCVD), atomic layer deposition (ALD), and the like, can also be used.

An interlayer dielectric (ILD) 920 is then formed on the CESL 910. The ILD 920 may be formed by chemical vapor deposition (CVD), high-density plasma CVD, spin-on, sputtering, or other suitable methods. In some embodiments, the ILD 920 includes silicon oxide. In some other embodiments, the ILD 920 may include silicon oxy-nitride, silicon nitride, or a low-k material.

A replacement gate (RPG) process scheme is employed. In the RPG process scheme, a dummy polysilicon gate (the dummy gate electrode 712 (see FIG. 11) in this case) is formed in advance and is replaced later by a metal gate. In some embodiments, the dummy gate stacks 710 are removed to form openings with the spacer structures 720 as their sidewalls. In some other embodiments, the dummy dielectric layers 610 (see FIG. 11) uncovered by the spacer structures 720 are removed as well. Some portions of the dummy dielectric layer 610 remain under the spacer structures 920. Alternatively, in some embodiments, the dummy gate stack 710 is removed while the dummy dielectric layer 610 retains. The dummy gate stack 710 (and the dummy dielectric layer 610) may be removed by dry etch, wet etch, or a combination of dry and wet etch. For example, a wet etch process may include exposure to a hydroxide containing solution (e.g., ammonium hydroxide), deionized water, and/or other suitable etchant solutions.

A high dielectric constant (high-κ) dielectric layer 1010 is conformally formed in the openings. The high-κ dielectric layer 1010 is over the semiconductor fins 310, the active regions 350, and the isolation structures 510. The high-κ dielectric layer 1010 has a dielectric constant (κ) higher than the dielectric constant of $SiO_2$, i.e. κ>3.9. The high-κ dielectric layer 1010 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The high-κ dielectric layer 1010 is deposited by suitable techniques, such as ALD, CVD, PVD, thermal oxidation, combinations thereof, or other suitable techniques.

At least one metal layer is formed in the openings and on the high-κ dielectric layer 1010. Subsequently, a chemical mechanical planarization (CMP) process is performed to planarize the metal layer and the high-κ dielectric layer 1010 to form metal gate stacks 1000 respectively in the openings. At least one of the metal gate stacks 1000 includes the high-κ dielectric layer 1010 and a metal gate electrode 1020 over the high-κ dielectric layer 1010. The metal gate electrode 1020 may include work function metal layer(s), capping layer(s), fill layer(s), and/or other suitable layers that are desirable in a metal gate stack. The work function metal layer may include n-type and/or p-type work function metal. Exemplary n-type work function metals include Ti, Ag, TaAl, TaAlC, TiAlN, TaC, TaCN, TaSiN, Mn, Zr, other suitable n-type work function materials, or combinations thereof. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. The work function metal layer may have multiple layers. The work function metal layer(s) may be deposited by CVD, PVD, electroplating and/or other suitable process. In some embodiments, the metal gate electrode 1020 is a p-type metal gate including a p-type work function metal layer. In some embodiments, the capping layer in the metal gate electrodes 1020 may include refractory metals and their nitrides (e.g. TiN, TaN, $W_2N$, TiSiN, TaSiN). The capping layer may be deposited by PVD, CVD, metal-organic chemical vapor deposition (MOCVD) ALD, or the like. In some embodiments, the fill layer in the metal gate electrodes 1020 may include tungsten (W). The metal layer may be deposited by ALD, PVD, CVD, or other suitable process.

Figure 13:
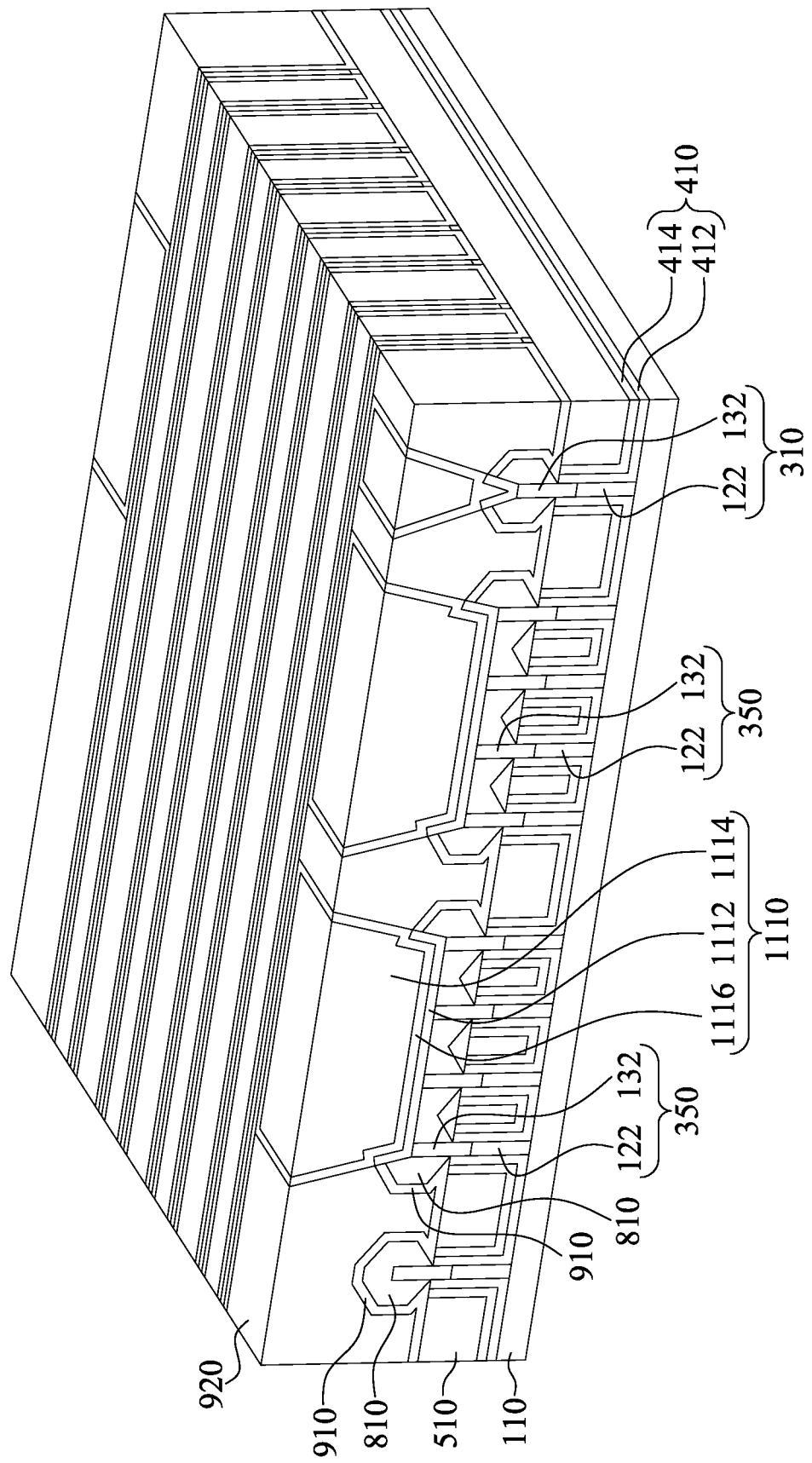

Reference is made to FIG. 13. The ILD 920 and the CESL 910 are etched to form a plurality of openings by various methods, including a dry etch, a wet etch, or a combination of dry etch and wet etch. The openings extend through the ILD 920 and the CESL 910 and expose the epitaxy structures 810, the active regions 350, and the semiconductor fins 310.

Cap layers 1112, which may be silicide layers, are formed in the openings and over the exposed epitaxy structures 810, the active regions 350, and the semiconductor fins 310 by a self-aligned silicide (salicide) process. The silicide process converts the surface portions of the epitaxy structures 810 and the semiconductor material of the active regions 350 and the semiconductor fins 310 into the silicide contacts. Silicide processing involves deposition of a metal that undergoes a silicidation reaction with silicon (Si). In order to form silicide contacts on the epitaxy structures 810, the active regions 350, and the semiconductor fins 310, a metal material is blanket deposited on the epitaxy structures 810, the active regions 350, and the semiconductor fins 310. After heating the wafer to a temperature at which the metal reacts with the silicon of the epitaxy structures 810, the active regions 350, and the semiconductor fins 310 to form contacts, unreacted metal is removed. The silicide contacts remain over the epitaxy structures 810, the active regions 350, and the semiconductor fins 310, while unreacted metal is removed from other areas. The silicide layer may include a material selected from titanium silicide, cobalt silicide, nickel silicide, platinum silicide, erbium silicide, palladium silicide, combinations thereof, or other suitable materials.

Filling materials 1114 are formed in the openings and respectively over the cap layers 1112. The filling materials 1114 are connected to the epitaxy structures 810, the active regions 350, and the semiconductor fins 310. In some embodiments, barrier layers 1116 are formed between the filling materials 1114 and the cap layers 1112 to prevent the filling material diffusing into the ILD 920. In some embodiments, metal materials can be filled in the openings, and excessive portions of the metal materials are removed by performing a CMP process to form the filling materials 1114. The filling materials 1114 can be made of tungsten, aluminum, copper, or other suitable materials. The filling materials 1114, the cap layers 1112, and the barrier layers 1116 are referred to as contacts 1110.

Although embodiments including semiconductor fins having epitaxial channels are discussed above, the present disclosure can be utilized to any suitable fin formation method, such as etching a bulk silicon substrate and implanting, or the like.

The liner layer is formed on the semiconductor fins before the end-to-end openings are formed to cut the semiconductor fins. After the semiconductor fins are cut, the liner layer would not be present on the end sidewalls of the fin structures. Therefore, the stress generated by the liner layer at the ends of the fin structures can be prevented, and thus the stress behavior of fin end can be modulated to suppress layout dependent effect due to stress of liner layer.

According to some embodiments of the disclosure, a method includes forming a plurality of semiconductor fins on a substrate; depositing a liner layer on the semiconductor fins and on the substrate conformally; and patterning the semiconductor fins to form a plurality of active regions on the substrate after depositing the liner layer.

In some embodiments, patterning the semiconductor fins includes forming a plurality of cut openings cutting through the semiconductor fins.

In some embodiments, patterning the semiconductor fins includes forming a plurality of end-to-end cut openings between the active regions.

In some embodiments, each of the active regions has at least one end sidewall exposed from the liner layer after the semiconductor fins are patterned.

In some embodiments, the method further includes forming an isolation layer sealing the active regions, and recessing the isolation layer such that a plurality of isolation structures are formed between bottom portions of the active regions.

In some embodiments, the method includes removing a first portion of the liner layer above the isolation structure such that a second portion of the liner layer remains between the bottom portions of the active regions and the isolation structures.

In some embodiments, patterning the semiconductor fins further removes portions of the liner layer between ends of the active regions.

According to some embodiments of the disclosure, a semiconductor device includes a substrate, and a first active region and a second active region on the substrate, in which the first active region and the second active region are end-to-end arranged. The semiconductor device includes an isolation structure directly in contact with bottom portions of the first active region and the second active region, and a liner layer deposited on sidewalls of the first and second active regions.

In some embodiments, the isolation structure is directly in contact with end sidewalls of the first and second active regions.

In some embodiments, the first active region has a first length along a first direction, the second active region has a second length along a second direction, and the first length is longer than the second length.

In some embodiments, the sidewalls of the first and second active regions are parallel to the first direction.

In some embodiments, the isolation structure surrounds bottom portions of the first and second active regions, and liner layer is disposed between the sidewalls of the first and second active regions and the isolation structure.

In some embodiments, the semiconductor device includes a plurality of gate electrodes extending across the first active region and the second active region, respectively.

In some embodiments, the semiconductor device includes a plurality of source/drain structures on the first and second active region and adjacent to the gate electrodes.

In some embodiments, an end sidewall of the first active region facing the second active region is free from coverage by the liner layer.

In some embodiments, an end sidewall of the second active region facing the first active region is free from coverage by the liner layer.

In some embodiments, the liner layer comprises an oxide layer, a silicon nitride layer, or combination thereof.

According to some embodiments of the disclosure, a semiconductor device includes a substrate, first, second, and third active regions on the substrate, and a liner layer. The first active region and the second active region are arranged end-to-end, and the first active region and the third active region are arranged side-by-side. The liner layer is deposited on the substrate and on sidewalls of the first and third active regions that facing each other, wherein end sidewalls of the first and second active regions that facing each other are free from coverage by the liner layer.

In some embodiments, the semiconductor device includes an isolation structure disposed between and directly in contact with the first and second active regions.

In some embodiments, the semiconductor device includes an isolation structure disposed between the first and third active regions, wherein the liner layer is disposed between the sidewalls of the first and third active regions and the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first semiconductive fin on a substrate;
   depositing a liner layer on the first semiconductive fin and on the substrate conformally;
   after depositing the liner layer, etching a first portion of the liner layer and a portion of the first semiconductive fin to separate the first semiconductive fin into second and third semiconductive fins on the substrate, wherein after etching the first semiconductive fin, each of the second and third semiconductive fins have first and second sidewalls that remain covered by the liner layer, and an end sidewall exposed by the liner layer;
   forming an isolation layer on the end sidewall of each of the second and third semiconductive fins and on the liner layer so that it extends along the first and second sidewalls of each of the second and third semiconductive fins;
   recessing the isolation layer, such that a top portion of the end sidewall of each of the second and third semiconductive fins is exposed and an isolation structure is formed between bottom portions of the second and third semiconductive fins;
   after recessing the isolation layer, forming a first dummy gate structure and a second dummy gate structure respectively on a portion of the second semiconductive fin and a portion of the third semiconductive fin; and
   replacing the first and second dummy gate structures respectively with first and second metal gate structures.

2. The method of claim 1, wherein etching the first semiconductive fin comprises:
   forming a cut opening cutting through the first semiconductive fin.

3. The method of claim 1, wherein etching the first semiconductive fin comprises:
   forming an end-to-end cut opening between the second and third semiconductive fins.

4. The method of claim 1, wherein the end sidewall of the second semiconductive fin faces the end sidewall of the third semiconductive fin.

5. The method of claim 1, wherein the end sidewall of each of the second and third semiconductive fins interconnects the first and second sidewalls of each of the second and third semiconductive fins.

6. The method at claim 1, further comprising:
removing a second portion of the liner layer above the isolation structure such that a third portion of the liner layer remains between the bottom portions of the second and third semiconductive fins and the isolation structure.

7. The method of claim 1; wherein the isolation layer directly contacts the exposed end sidewalls of the second and third semiconductive fins.

8. The method of claim 6, wherein a topmost surface of the third portion of the liner layer is level with a topmost surface of the isolation structure.

9. A method comprising:
depositing a liner layer on a first semiconductive fin and on a substrate conformally;
after depositing the liner layer, removing a portion of the first semiconductive fin and a portion of the liner layer thereon, such that the first semiconductive fin is separated into second and third semiconductive fins, wherein the second and third semiconductive fins are end-to-end arranged on the substrate, and after etching the first semiconductive fin, each of the second and third semiconductive fins have first and second sidewalls that remain covered by the liner layer, and a first end sidewall exposed by the liner layer;
depositing a dielectric material on the first end sidewall of each of the second and third semiconductive fins and on the liner layer so that it extends along the first and second sidewalls of each of the second and third semiconductive fins; and
recessing the dielectric material, such that a portion of the first end sidewall of each of the second and third semiconductive fins is exposed and an isolation structure is formed between bottom portions of the second and third semiconductive fins.

10. The method of claim 9, wherein a second end sidewall of the second semiconductive fin is covered by the liner layer, after the portion of the first semiconductive fin and the portion of the liner layer are removed.

11. The method of claim 10, wherein depositing the dielectric material is performed such that the dielectric material directly contacts the first end sidewall of the second semiconductive fin.

12. The method of claim 10, wherein depositing the dielectric material is performed such that the liner layer remains between the dielectric material and the second end sidewall of the second semiconductive fin.

13. The method of claim 10, wherein a second end sidewall of the third semiconductive fin is covered by the liner layer, after the portion of the first semiconductive fin and the portion of the liner layer are removed.

14. The method of claim 13, wherein depositing the dielectric material is performed such that the dielectric material directly contacts the first end sidewall of the second semiconductive fin and the first end sidewall of the third semiconductive fin.

15. A method comprising:
forming a first semiconductive fin on a substrate, wherein the first semiconductive fin has a top surface and sidewalls;
depositing a liner layer on the top surface and the sidewalls of the first semiconductive fin;
etching a first portion of the liner layer and a portion of the first semiconductive fin, such that the first semiconductive fin is separated into second and third semiconductive fins, and second and third portions of the liner layer remain respectively on first and second sidewalls of the second and third semiconductive fins and the liner layer exposes an end sidewall of the second and third semiconductive fins;
depositing a dielectric material on the end sidewall of each of the second and third semiconductive fins and on the second and third portions of the liner layer so that it extends along the first and second sidewalls of each of the second and third semiconductive fins; and
after etching the first portion of the liner layer and the portion of the first semiconductive fin, etching an upper portion of the dielectric material and upper sub-portions of the second and third portions of the liner layer, such that upper portions of the end sidewall of each of the second and third semiconductive fins are exposed.

16. The method of claim 15, wherein depositing the liner layer comprises:
depositing an oxide layer on the top surface and the sidewalls of the first semiconductive fin; and
depositing a nitride layer on the oxide layer.

17. The method of claim 15, further comprising:
forming a gate electrode extending across the second semiconductive fin; and
forming a plurality of source/drain structures on the second semiconductive fin and adjacent the gate electrode.

18. The method of claim 17, further comprising:
forming a contact etch stop layer conformally formed on the source/drain structures and in contact with a topmost surface of the liner layer.

19. The method of claim 15, further comprising forming a first dummy gate structure and a second dummy gate structure respectively across of the second and third semiconductive fins.

20. The method of claim 19, further comprising replacing the first and second dummy gate structures respectively with first and second metal gate structures.

* * * * *